United States Patent
Jung et al.

(10) Patent No.: US 10,852,644 B2
(45) Date of Patent: Dec. 1, 2020

(54) OPTICAL PROXIMITY CORRECTION METHOD AND METHOD OF FABRICATING LITHOGRAPHY MASK BY USING THE SAME

(71) Applicant: Samsung Electronics Co., Ltd., Suwon-si (KR)

(72) Inventors: Byung-je Jung, Hwaseong-si (KR); No-young Chung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/385,203

(22) Filed: Apr. 16, 2019

(65) Prior Publication Data
US 2020/0124979 A1 Apr. 23, 2020

(30) Foreign Application Priority Data
Oct. 19, 2018 (KR) .......................... 10-2018-0125405

(51) Int. Cl.
*G03F 7/20* (2006.01)
*G06F 30/30* (2020.01)

(52) U.S. Cl.
CPC .......... *G03F 7/70441* (2013.01); *G06F 30/30* (2020.01)

(58) Field of Classification Search
USPC ......................................................... 716/53
See application file for complete search history.

(56) References Cited

U.S. PATENT DOCUMENTS

| 7,571,416 | B2 | 8/2009 | Watanabe | |
| 8,214,770 | B2 | 7/2012 | Mukherjee et al. | |
| 8,924,896 | B2 | 12/2014 | Wang et al. | |
| 9,811,615 | B2 | 11/2017 | Lippincott et al. | |
| 2013/0227498 | A1 | 8/2013 | Pathak et al. | |
| 2014/0038392 | A1* | 2/2014 | Yonehara | H01L 21/304 438/463 |
| 2015/0380326 | A1* | 12/2015 | Chen | H01L 23/481 324/538 |
| 2016/0291458 | A1 | 10/2016 | He et al. | |
| 2016/0341791 | A1* | 11/2016 | Duffy | G01R 31/307 |
| 2017/0052452 | A1 | 2/2017 | Mailfert et al. | |
| 2018/0144974 | A1* | 5/2018 | Hellmund | H01L 21/743 |
| 2018/0165397 | A1 | 6/2018 | Chang et al. | |

* cited by examiner

*Primary Examiner* — Mohammed Alam
(74) *Attorney, Agent, or Firm* — Harness, Dickey & Pierce, P.L.C.

(57) ABSTRACT

An optical proximity correction (OPC) method may include providing a design layout including conductive patterns, determining line end void (LEV)-risk patterns among the conductive patterns, the LEV-risk patterns each having a risk of suffering from poor contact due to an LEV, setting markers including portions of the LEV-risk patterns and portions of the conductive patterns adjacent to the LEV-risk patterns, performing a first OPC on first patterns included in the markers and performing a second OPC on second patterns outside the markers, the second OPC being different from the first OPC, and each of the first OPC and the second OPC being performed a plurality of times, and calculating a cost function of each of the markers. The determining may include comparing risks of occurrence of poor contact in each of the conductive patterns based on a scoring function, and the scoring function may be inversely proportional to a width of each of the conductive patterns.

20 Claims, 8 Drawing Sheets

OPTICAL PROXIMITY CORRECTION METHOD AND METHOD OF FABRICATING LITHOGRAPHY MASK BY USING THE SAME

CROSS-REFERENCE TO RELATED APPLICATION

This application claims the benefit of Korean Patent Application No. 10-2018-0125405, filed on Oct. 19, 2018, in the Korean Intellectual Property Office, the disclosure of which is incorporated herein in its entirety by reference.

BACKGROUND

The inventive concepts relate to an optical proximity correction methods and/or methods of fabricating an extreme ultraviolet (EUV) mask by using the same, and more particularly, to optical proximity correction (OPC) methods exhibiting improved reliability and/or methods of fabricating a lithography mask by using the same.

Lithography processes among fabrication processes of semiconductor chips are techniques of forming circuit patterns by irradiating light onto a photosensitive layer coated on a substrate. Recently, due to the trend in semiconductor manufacturing processes for finer-sized features, exposure methods using deep ultraviolet (DUV) rays, EUV rays, or electron beams attract attention. As patterns have finer sizes, an optical proximity effect (OPE) due to influences between adjacent patterns occurs during exposure processes. To solve such OPE, studies on optical proximity correction (OPC) are being carried out.

SUMMARY

Some example embodiments of the inventive concepts provide optical proximity correction (OPC) methods exhibiting improved reliability and/or methods of fabricating a lithography mask by using the OPC method.

The inventive concepts are not limited to the aspect set forth above, and other aspects of the inventive concepts will be clearly understood by those skilled in the art from the following descriptions.

According to an example embodiment of the inventive concepts, an optical proximity correction (OPC) method may include providing a design layout including conductive patterns, determining line end void (LEV)-risk patterns among the conductive patterns, the LEV-risk patterns each having a risk of suffering from poor contact due to an LEV, setting markers including portions of the LEV-risk patterns and portions of the conductive patterns adjacent to the LEV risk patterns, performing LEV-aware OPC on the LEV-risk patterns, and calculating at least one cost function of each of the markers. The LEV-aware OPC may take a bridge target pattern as a target shape and the bridge target pattern may be determined by a bridge target that is a minimum distance between the conductive patterns.

According to an example embodiment of the inventive concepts, an optical proximity correction (OPC) method may include providing a design layout including conductive patterns, determining line end void (LEV)-risk patterns among the conductive patterns, the LEV-risk patterns each having a risk of suffering from poor contact due to an LEV, setting markers including portions of the LEV-risk patterns and portions of the conductive patterns adjacent to the LEV-risk patterns, performing a first OPC on first patterns included in the markers and performing a second OPC on second patterns outside the markers, the second OPC being different from the first OPC, and each of the first OPC and the second OPC being performed a plurality of times, and calculating a cost function of each of the markers. The determining may include comparing risks of occurrence of poor contact in each of the conductive patterns based on a scoring function, and the scoring function may be inversely proportional to a width of each of the conductive patterns.

According to an example embodiment of the inventive concepts, a method of fabricating a lithography mask may include providing a design layout including conductive patterns, performing optical proximity correction (OPC) on the design layout, and fabricating the lithography mask according to a result of the performing. The performing may include determining line end void (LEV)-risk patterns among the conductive patterns, the LEV-risk patterns each having a risk of suffering from poor contact due to an LEV, setting markers including portions of the LEV-risk patterns and portions of the conductive patterns adjacent to the LEV-risk patterns, performing first OPC on patterns inside the markers and performing second OPC on patterns outside the markers, the second OPC being different from the first OPC, and calculating each of a plurality of cost functions of each of the markers by using an LEV-aware OPC best contour and a process window condition (PWC) contour, the LEV-aware OPC best contour being a first contour according to an optimum condition for each LEV-risk pattern that has been modified by the first OPC, and the PWC contour being a second contour according to a PWC for each of the LEV-risk patterns that has been modified by the first OPC.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION

Hereinafter, some example embodiments of the inventive concepts will be described in detail with reference to the accompanying drawings Like components will be denoted by like reference numerals throughout the specification, and repeated descriptions thereof will be omitted.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Figure 1:
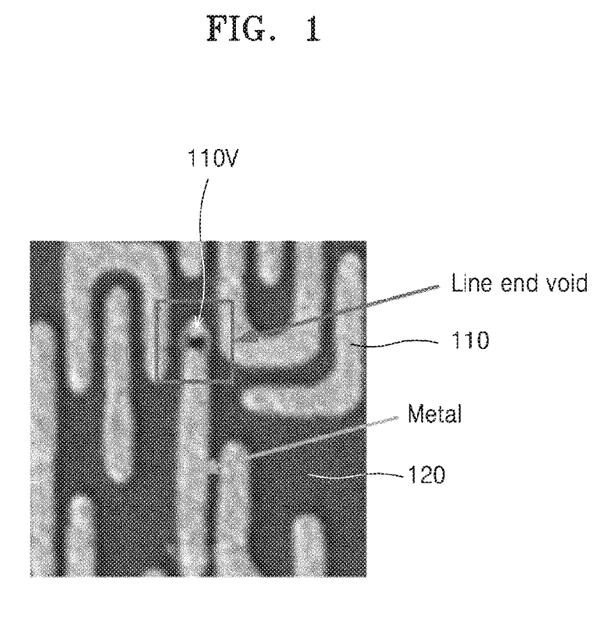
FIG. 1 is a layout image illustrating issues of both an optical proximity correction (OPC) method of a comparative example and a method of fabricating a semiconductor device by using the OPC method.

FIG. 1 is a layout image illustrating issues of both an optical proximity correction (OPC) method of a comparative example and a method of fabricating a semiconductor device by using the OPC method.

Referring to FIG. 1, a semiconductor chip may include a circuit pattern. The circuit pattern may include a plurality of wiring layers and vias making connections between the wiring layers. According to some example embodiments, each of the wiring layers may include a conductive pattern 110 and an insulating layer 120.

According to some example embodiments, the conductive pattern 110 may form an electrical path for operations of the semiconductor chip. According to some example embodiments, the conductive pattern 110 may be connected to a via of an underlayer thereunder and a via of a subsequent layer subsequent thereto. Here, in an etching process for forming the conductive pattern 110 having a line shape, a skew may occur in an end portion of the conductive pattern 110 due to an optical proximity effect or the like.

To solve the issue set forth above, a final target layout may be determined by applying a line end etch skew bias to a layout designed according to design rules, followed by performing OPC, in which shapes of conductive patterns included in the designed layout are modified such that an actual implemented circuit pattern is close to the final target layout. The OPC may be repeatedly performed, and as the OPC is further repeated, an actual pattern formed on a wafer by using a modified conductive pattern may be increasingly closer to an initial design.

Here, the end portion of the conductive pattern 110 having a line shape may have a shape narrowing toward the end thereof. Such a shape of a line pattern may cause a line end void (LEV) defect 110V by which a metal does not properly fill a region near the end portion of the conductive pattern 110. The conductive pattern 110 may be connected to a conductive via to be connected to a conductive pattern of an underlayer thereunder or a conductive pattern of a subsequent layer subsequent thereto, and when the conductive via is formed adjacent to the end portion of the conductive pattern 110, a fault of the semiconductor chip may be generated due to electrical disconnection caused by the LEV defect 110V.

Figure 2:
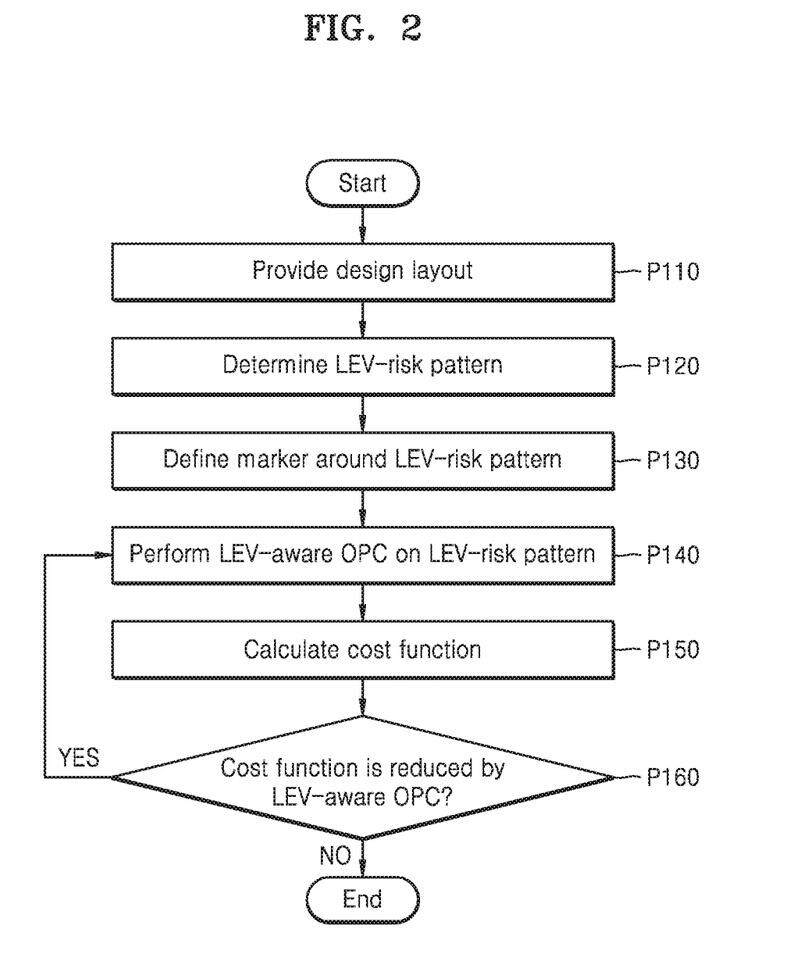
FIG. 2 is a flowchart illustrating an OPC method according to some example embodiments.

FIG. 2 is a flowchart illustrating an OPC method according to some example embodiments.

Figure 3:
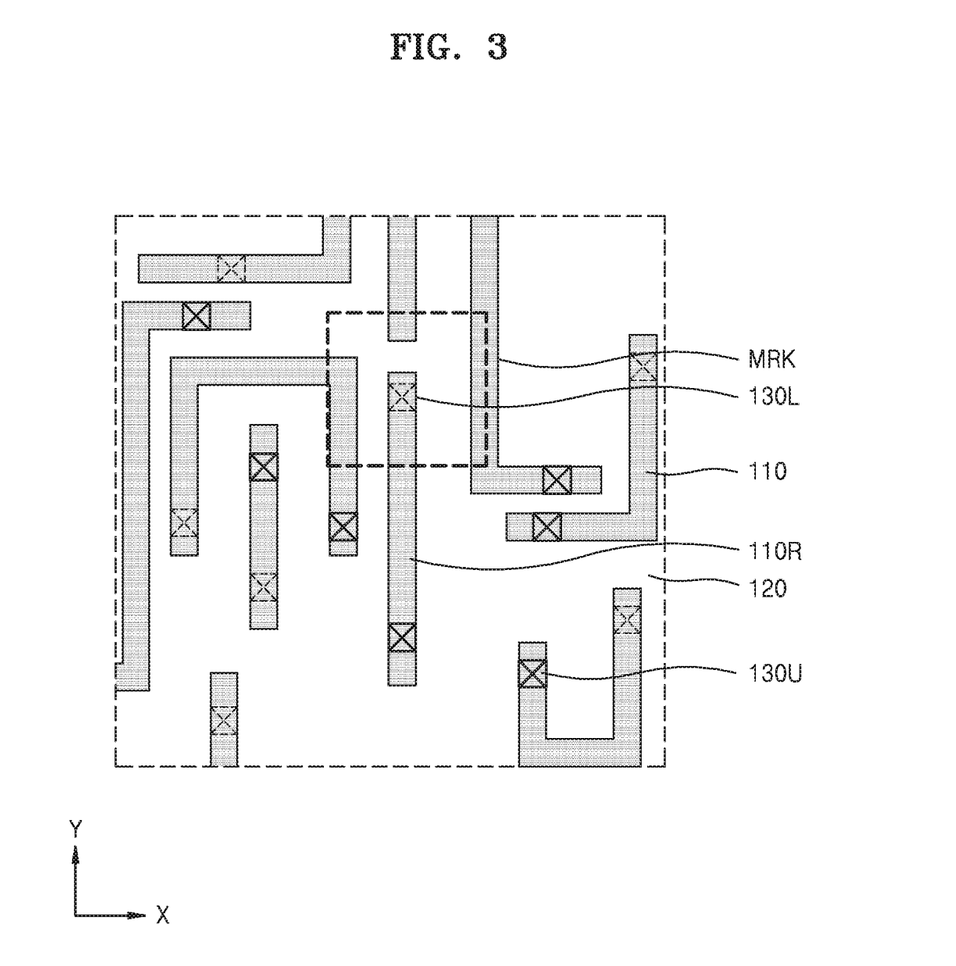
FIG. 3 is a layout diagram illustrating an OPC method according to some example embodiments.

FIG. 3 is a layout diagram illustrating an OPC method according to some example embodiments.

Figure 4:
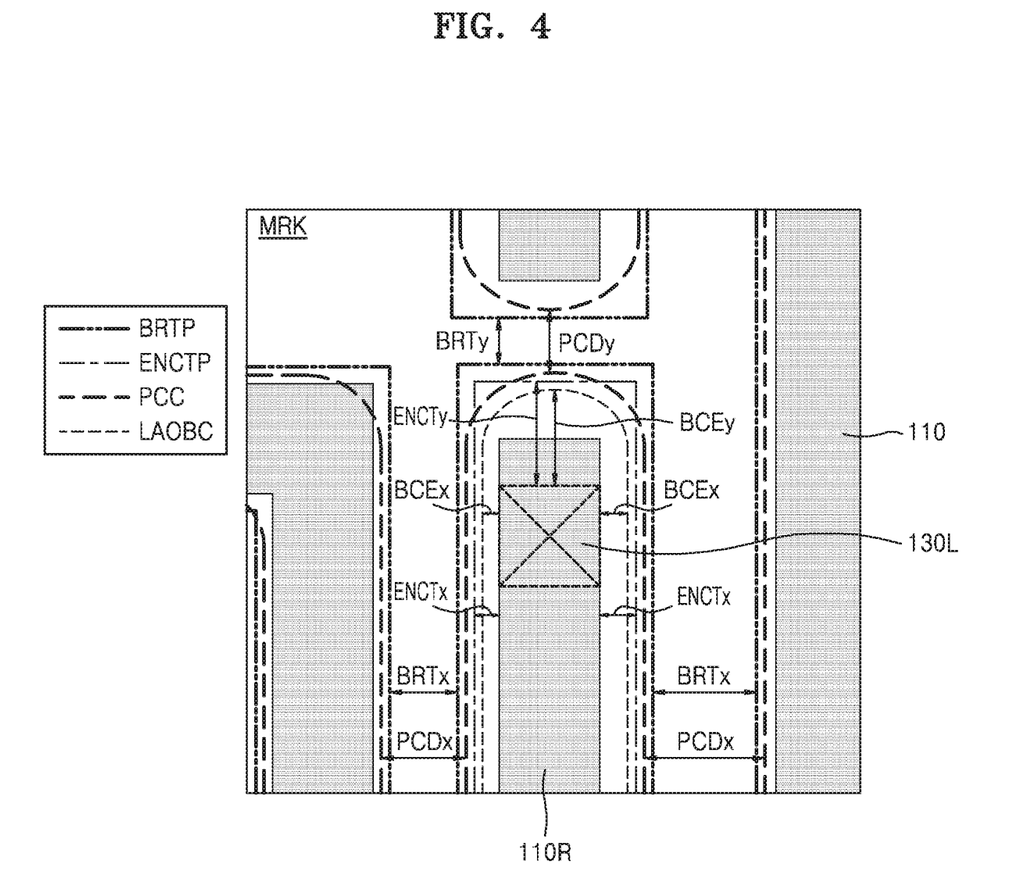
FIG. 4 is a partial layout diagram illustrated by enlarging a market MRK of the layout diagram of FIG. 3.

FIG. 4 is a partial layout diagram illustrated by enlarging a marker MRK of the layout diagram of FIG. 3.

Referring to FIGS. 2 and 3, in operation P110, a design layout may be provided. The design layout may include various geometric patterns for implementing a semiconductor chip. The design layout may extend in first and second directions (or alternatively, horizontal and vertical directions, or X and Y directions in a Cartesian coordinate system) crossing perpendicular to each other. The design layout may include conductive patterns 110 of line shapes, which have desired (or alternatively, predetermined) widths and extend in the first direction (X direction) or the second direction (Y direction). According to some example embodiments, the conductive patterns 110 may be designed according to desired (or alternatively, predetermined) design rules.

The design layout may include a metal pattern, an oxide pattern, a semiconductor pattern, or the like for implementing various components of the semiconductor chip. The components may include, for example, active regions, gate electrodes, metal lines, vias for providing interlayer connections, and bonding pads. The components may be formed on a semiconductor substrate or on various material layers deposited on the semiconductor substrate. The design layout may be stored as one or more data files having information on geometric patterns. For example, the design layout may be stored in any appropriate format readable by a computer, such as a Graphic Data System II (GDSII) data format, a Caltech Intermediate Form (CIF) data format, an Open Artwork System Interchange Standard (OASIS) data format, or the like.

According to some example embodiments, the conductive patterns 110 may be connected to upper and lower conductive vias 130U and 130L. According to some example embodiments, to implement the semiconductor chip, the design layout may include a plurality of layouts, each including an insulating layer 120 and the conductive patterns 110, and the upper and lower conductive vias 130U and 130L providing interlayer connection between overlying and underlying conductive patterns 110.

A via marked by a dashed line in FIG. 3 may be a lower conductive via 130L that connects a conductive pattern 110 included in a layout to a conductive pattern 110 included in a layout underlying the layout set forth above. A via marked by a solid line in FIG. 3 may be an upper conductive via 130U that connects a conductive pattern 110 included in a layout to a conductive pattern included in a layout subsequent to or overlying the layout set forth above.

According to some example embodiments, each of the conductive patterns 110 and the upper and lower conductive vias 130U and 130L may include a conductive material. According to some example embodiments, each of the conductive patterns 110 and the upper and lower conductive vias 130U and 130L may include a doped semiconductor material or a metal material. According to some example embodiments, each of the conductive patterns 110 and the upper and lower conductive vias 130U and 130L may include at least one selected from the group consisting of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), and graphene or include an alloy thereof or the like.

Next, in operation P120, an LEV-risk pattern 110R may be selected. Here, the LEV-risk pattern 110R refers to a pattern having a risk (e.g., a relatively high risk relative to a reference value) of generating an LEV defect among the conductive patterns 110. A comparison of risks of generating the LEV defect will be described with reference to FIGS. 5 and 6.

Figure 5:
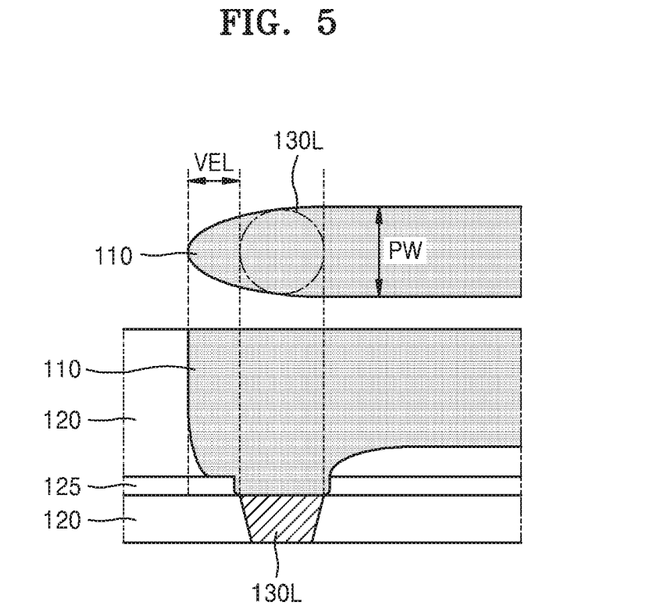
FIG. 5 is a conceptual diagram illustrating an OPC method according to some example embodiments.
Figure 6:
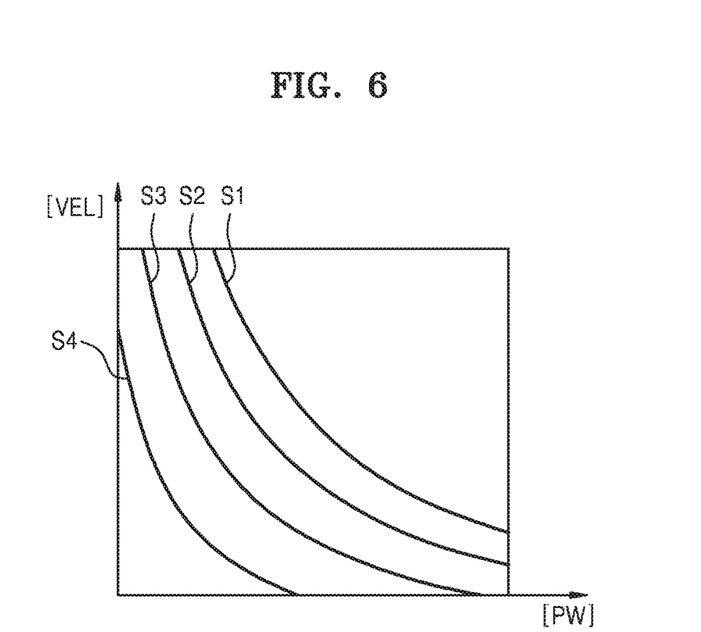
FIG. 6 is a graph illustrating an OPC method according to some example embodiments.

FIG. 5 is a conceptual diagram illustrating an OPC method according to some example embodiments, and FIG. 6 is a graph illustrating an OPC method according to some example embodiments.

Referring to FIG. 5, both a layout diagram and a cross-sectional view of an end portion of the conductive pattern 110 having a line shape are illustrated.

Referring to FIG. 5, the conductive pattern 110 may have a line shape. As described above, the end portion of the conductive pattern 110 implemented on a wafer may have a shape narrowing toward the end thereof.

A conductive liner may be further arranged between the conductive pattern 110 and the insulating layer 120 and between the conductive pattern 110 and the lower conductive via 130L, without being limited thereto. In addition, an insulating liner 125 may be arranged between adjacent insulating layers 120.

For convenience, a length from the lower conductive via 130L to an end point of the conductive pattern 110 adjacent to the lower conductive via 130L in an extension direction of the conductive pattern 110 is referred to as a via end length VEL. In other words, a distance between an end of a conductive pattern 110 and the lower conductive via 130L contacting the conductive pattern 110 in an extension direction of the conductive pattern 110 is referred to as the via end length VEL. In addition, a width of the conductive pattern 110 in a direction perpendicular to a direction in which the conductive pattern 110 extends lengthways is referred to as a pattern width PW. According to some example embodiments, a risk of a fault of the semiconductor chip due to a generation of an LEV may be evaluated by using the via end length VEL and the pattern width PW.

Although, in relation to FIG. 5, the risk of the fault of the semiconductor chip due to the LEV is described on the basis of the end portion of the conductive pattern 110 adjacent to the lower conductive via 130L, descriptions thereof may be made likewise on the basis of the upper conductive via 130U (see FIG. 3) and the conductive pattern 110 adjacent to the upper conductive via 130U.

According to some example embodiments, a scoring function for evaluating the risk of the fault of the semiconductor chip due to a generation of the LEV may be determined by using the via end length VEL and the pattern width PW, as shown in Mathematical Equation 1.

$$SF(VEL, PW) = \frac{a}{VEL} \cdot \frac{b}{PW} \qquad \text{[Mathematical Equation 1]}$$

wherein each of a and b is a proportional coefficient and may have a dimension of a length, without being limited thereto. The scoring function is for comparison using a relative numerical value and has a normalized value.

Referring to FIG. 6, a plurality of contour lines of values of the scoring function with regard to the via end length VEL and the pattern width PW according to Mathematical Equation 1 are illustrated.

According to some example embodiments, as the via end length VEL and the pattern width PW increase, the risk of fault generation due to the LEV may decrease, and as the via end length VEL and the pattern width PW decrease, the risk of fault generation due to the LEV may increase. S1 to S4 represent contour lines obtained by connections between sets of a value of the via end length VEL and a value of the pattern width PW, which make equal values of the scoring function, and may be contour lines respectively corresponding to increasingly greater values of the scoring function in this stated order. For example, S1, S2, S3, and S4 may respectively correspond to about 20, about 40, about 60, and about 80, without being limited thereto. For each design layout, a threshold value of the scoring function may be determined from on-line and off-line data regarding fault generation, and a pattern having a greater value of the scoring function than the threshold value may be classified as an LEV-risk pattern.

Referring again to FIGS. 2 and 3, the determining of the LEV-risk pattern in operation P120 may include determining the LEV-risk pattern 110R from existing on-line/off-line data regarding fault inspection for a layout implemented on a wafer.

According to some example embodiments, the determining of the LEV-risk pattern 110R in operation P120 may include performing full chip matching based on the LEV-risk pattern 110R determined from the scoring function or the existing on-line/off-line data. The full chip matching may include finding conductive patterns 110 identical or substantially similar to the LEV-risk pattern 110R among the conductive patterns 110 included in the design layout. According to some example embodiments, the conductive patterns 110 identical or substantially similar to the LEV-risk pattern 110R means that the conductive patterns 110 have shapes identical or substantially similar to that of the LEV-risk pattern 110R as well as have relative positions identical or substantially similar to that of the LEV-risk pattern 110R with reference to the upper conductive via 130U or the lower conductive via 130L.

Next, in operation P130, markers MRK including the determined LEV-risk pattern 110R may be defined. According to some example embodiments, the markers MRK may be regions undergoing different OPC from OPC applied to adjacent different portions of the design layout when the OPC is performed. According to some example embodiments, the markers MRK may be regions undergoing LEV-aware OPC described below. According to some example embodiments, centers of the markers MRK each may be located near a region in which the LEV-risk pattern 110R contacts the lower conductive via 130L or the upper conductive via 130U, without being limited thereto. According to some example embodiments, the markers MRK may be regions having square shapes. According to some example embodiments, the markers MRK may be regions of square shapes in which half of a length of one side is a maximum distance that is set, in the OPC, as causing interactions between patterns, without being limited thereto. For example, the markers MRK may have any appropriate shapes such as circles, ellipses, rectangles, or the like.

Next, in operation P140, the LEV-aware OPC may be performed on the LEV-risk pattern 110R. According to some example embodiments, when the LEV-aware OPC is performed, OPC according to the related art may be performed together with the LEV-aware OPC. According to some example embodiments, the OPC according to the related art may be performed on regions external to the markers MRK.

According to some example embodiments, the LEV-aware OPC may be different from the OPC according to the related art. The LEV-aware OPC will be described with reference to FIG. 4.

FIG. 4 is a diagram illustrated by enlarging a marker MRK of FIG. 3. Referring to FIG. 4, a designed shape, a target pattern shape, and a contour shape of each of the conductive pattern 110 and the LEV-risk pattern 110R are illustrated. For example, targets according to conditions (e.g., a best condition or a process window condition) are shown by using dashed single-dotted lines and dashed double-dotted lines, and contours obtained by simulations are shown by using dashed lines.

As used herein, the term "best condition" refers to an optimum dose and focus condition for forming a specific layout. The best condition may vary for each device intended to be formed and for each pattern to be implemented.

The process window condition (PWC) may include a focus condition defocused from the best condition by as much as a set numerical value and/or a changed dose condition from the best condition by as much as a set numerical value. According to some example embodiments, the PWC may include a plurality of focus and dose conditions, without being limited thereto. For example, the PWC may include one focus and dose condition or consecutive focus and dose conditions.

A bridge target pattern BRTP is shown as a dashed double-dotted line, and may be determined from first and second bridge targets BRTx and BRTy. The first and second bridge targets BRTx and BRTy may be determined from process data regarding an identical or substantially similar layout to a layout intended to undergo the LEV-aware OPC. However, the inventive concepts are not limited thereto. In some example embodiments, the first and second bridge targets BRTx and BRTy may be determined from simulation data regarding the layout intended to undergo the LEV-aware OPC. Each of the first and second bridge targets BRTx and BRTy may be a minimum distance allowing a bridge that may cause to an unintended short-circuit between adjacent conductive patterns 110, between the LEV-risk pattern 110R and the conductive pattern 110 adjacent thereto, or between adjacent LEV-risk patterns 110R. The first and second bridge targets BRTx and BRTy may be bridge targets in the first direction (X direction) and the second direction (Y direction), respectively, and may have different values from each other.

The bridge target pattern BRTP may be a maximum-size pattern satisfying the first and second bridge targets BRTx and BRTy. That is, when each of the conductive patterns 110 or the LEV-risk pattern 110R is larger than the bridge target pattern BRTP, a bridge may occur due to a small distance between adjacent patterns.

An enclosure target pattern ENCTP is shown as a dashed single-dotted line, and may be a target shape determined by first and second enclosure targets ENCTx and ENCTy and the LEV-risk pattern 110R or the LEV-risk pattern 110R modified by the LEV-aware OPC. In other words, the LEV-aware OPC may take the enclosure target pattern ENCTP as a target shape, the enclosure target pattern being determined by a first enclosure target ENCTx and a second enclosure target ENCTy. As used herein, the term 'enclosure' refers to a distance from the upper conductive via 130U or the lower conductive via 130L adjacent to the end portion of the LEV-risk pattern 110R to an end point of the LEV-risk pattern 110R the conductive patterns 110 in the first or second direction (X or Y direction).

According to some example embodiments, the first and second enclosure targets ENCTx and ENCTy may be determined from process data regarding an identical or substantially similar layout to a layout intended to undergo the LEV-aware OPC. However, the inventive concepts are not limited thereto, and the first and second enclosure targets ENCTx and ENCTy may be determined from simulation data regarding the layout intended to undergo the LEV-aware OPC. The first and second enclosure targets ENCTx and ENCTy may be enclosure targets in the first direction (X direction) and the second direction (Y direction), respectively, and may have different values from each other.

According to some example embodiments, the enclosure target pattern ENCTP may be a minimum-size pattern satisfying the first and second enclosure targets ENCTx and ENCTy in the first and second directions (X and Y directions), respectively. That is, a sum of first-direction (X-direction) distances from an outer border of the enclosure target pattern ENCTP to the lower conductive via 130L may be the first enclosure target ENCTx, and a sum of second-direction (Y-direction) distances from the outer border of the enclosure target pattern ENCTP to the lower conductive via 130L may be the second enclosure target ENCTy.

The modification of the conductive pattern 110 and the LEV-risk pattern 110R by the OPC and the LEV-aware OPC may be iterated a plurality of times. According to some example embodiments, the LEV-aware OPC may be OPC using the first and second bridge targets BRTx and BRTy and the first and second enclosure targets ENCTx and ENCTy. According to some example embodiments, the LEV-aware OPC may be OPC that secures a margin between the lower conductive via 130L and a line end by taking the first and second enclosure targets ENCTx and ENCTy as targets and secures a bridge margin between adjacent patterns by taking the first and second bridge targets BRTx and BRTy as targets.

According to some example embodiments, the OPC according to the related art may be performed on both the conductive pattern 110 and the LEV-risk pattern 110R outside the marker MRK.

Referring to FIGS. 2 and 4, in operation P150, a cost function may be calculated. According to some example embodiments, the calculating of the cost function may include calculating each of an LEV-risk pattern 110R-PWC contour distance, a PWC target enclosure, and a best contour enclosure.

A PWC contour PCC is shown as a long-dashed line and is obtained by simulating a shape when the LEV-risk pattern 110R modified by the LEV-aware OPC is implemented on a wafer by a lithography process under the PWC. When the PWC includes a plurality of conditions or includes consecutive conditions, the PWC contour PCC may be determined by using the PWC allowing a largest contour to be obtained, among the plurality of conditions or the consecutive conditions. When the LEV-risk pattern 110R is divided into a plurality of partial patterns, the PWC contour PCC may be determined by applying a different PWC to each divided partial pattern of the LEV-risk pattern 110R, without being limited thereto. Dividing each of the conductive pattern 110 and the LEV-risk pattern 110R into partial patterns may be performed by any division method known in the related art (e.g., a method including dividing a pattern in a corner region and dividing a pattern greater than a desired (or alternatively, predetermined) length into equal parts).

While a lithography process is performed, exposure may be performed locally under a different exposure condition from the best condition due to effects caused by aberrations, or interference between adjacent patterns (e.g., flare). Due to such a local tolerance, a pattern having a line width greater than a result simulated by using the best condition may be transferred onto a wafer. According to some example embodiments, the PWC contour PCC may be determined based on largest patterns calculated by using the PWC, thereby mitigating or preventing the generation of a bridge in both the LEV-risk pattern 110R modified by the LEV-aware OPC and the conductive pattern 110.

According to some example embodiments, a PWC contour distance may be determined from the PWC contour PCC. The PWC contour distance may be a sum of distances between a PWC contour PCC of the LEV-risk pattern 110R and PWC contours PCC of the conductive patterns 110 adjacent to the LEV-risk pattern 110R, in FIG. 4. For example, the PWC contour distance may be a sum of first and second PWC contour distances PCDx and PCDy.

Here, the first PWC contour distances PCDx each refer to a first-direction (X-direction) distance between the PWC contour PCC of the LEV-risk pattern 110R and the PWC contours PCC of the conductive patterns 110 spaced apart from the LEV-risk pattern 110R in the first direction (X direction). In addition, the second PWC contour distances PCDy each refer to a second-direction (Y-direction) distance between the PWC contour PCC of the LEV-risk pattern 110R and the PWC contours PCC of the conductive patterns 110 spaced apart from the LEV-risk pattern 110R in the second direction (Y direction). Here, first and second PWC target distances PTDx and PTDy (not shown), which are greater than a desired (or alternatively, predetermined) numerical value may be excluded upon calculating a PWC target due to a relatively low risk of generating a bridge between patterns.

In FIG. 4, because a second-direction (Y-direction) end portion of the PWC contour PCC has a shape with round corners, the second PWC target distance PTDy may be selected as a minimum distance from among second-direction (Y-direction) distances between the PWC contours PCC of the conductive patterns 110 and the PWC contour PCC of the LEV-risk pattern 110R.

Therefore, the PWC contour distance PCD may be determined by Mathematical Equation 2.

$$PCD = \Sigma PCDx + \Sigma PCDy \quad \text{[Mathematical Equation 2]}$$

An LEV-aware OPC best contour LAOBC is shown as a short dashed line, and is obtained by simulating a shape when the LEV-risk pattern 110R modified by the LEV-aware OPC is implemented on a wafer by a lithography process under the best (or alternatively, optimum) condition.

According to some example embodiments, a best contour enclosure may be determined from the LEV-aware OPC best contour LAOBC. According to some example embodiments, the best contour enclosure may be a sum of distances between an edge of the lower conductive via 130L contacting the LEV-risk pattern 110R in the marker MRK and the LEV-aware OPC best contour LAOBC. For example, the best contour enclosure may be a sum of first and second best contour enclosures BCEx and BCEy.

Here, the first best contour enclosures BCEx refer to first-direction (X-direction) distances between the lower conductive via 130L contacting the LEV-risk pattern 110R and the LEV-aware OPC best contour LAOBC. The second best contour enclosures BCEy refer to second-direction (Y-direction) distances between the lower conductive via 130L contacting the LEV-risk pattern 110R and the LEV-aware OPC best contour LAOBC.

The best contour enclosure BCE may be determined by Mathematical Equation 3.

$$BCE = \Sigma BCEx + \Sigma BCEy \quad \text{[Mathematical Equation 3]}$$

In addition, a bridge target distance BTD and an enclosure target distance ETD may be determined by Mathematical Equation 4.

$$BTD = \Sigma BRTx + \Sigma BRTy$$

$$ETD = \Sigma ENCTx + \Sigma ENCTy \quad \text{[Mathematical Equation 4]}$$

wherein BRTx and BRTy represent the first and second bridge targets BRTx and BRTy described above, respectively, and ENCTx and ENCTy represent the first and second PWC target enclosures ENCTx and ENCTy described above, respectively.

According to some example embodiments, a cost function of an i-th iteration of the OPC, that is, Ci, may be calculated by Mathematical Equation 5. Here, i indicates the number of times the OPC is performed and is an ordinal number equal to or greater than 0, and i=0 means that the OPC has not been performed yet.

[Mathematical Equation 5]
$$Ci = \sum_{f=1}^{n} \left( \sqrt{[\{PCD - BTD\}_f]^2} + \sqrt{[\{BCE - ETD\}_f]^2} \right)$$

In some example embodiments, the i-th cost function, that is, Ci, may be calculated by Mathematical Equation 6.

[Mathematical Equation 6]
$$Ci = \sum_{f=1}^{n} \left( [\{PCD - BTD\}_f]^2 + [\{BCE - ETD\}_f]^2 \right)$$

In Mathematical Equations 5 and 6, f is an ordinal number for indicating a partial pattern in a marker. According to some example embodiments, the cost function may be calculated separately for each marker MRK. As described above, the LEV-risk pattern 110R may be divided into partial patterns during the OPC, and each of the partial patterns of the LEV-risk pattern 110R may be differently modified according to the LEV-aware OPC. Therefore, the cost function, that is, Ci, corresponding to each marker MRK is defined as being proportional to a difference between the PWC contour distance PCD and the bridge target distance BTD for each partial pattern, and to a difference between the best contour enclosure BCE and the enclosure target distance ETD for each partial pattern.

Next, in operation P160, the cost function of the i-th iteration may be compared with the cost function of the i−1-th iteration. According to some example embodiments, the comparison between the cost functions may be performed separately for each marker MRK.

When the cost function of the i-th iteration is reduced from the cost function of the i−1-th iteration ("Yes"), returning to operation P140, the markers MRK corresponding thereto may undergo the iteration of the LEV-aware OPC.

When the cost function of the i-th iteration is increased from the cost function of the i−1-th iteration ("No"), the markers MRK corresponding thereto may take a result of the i−1-th LEV-aware OPC as a final result. Therefore, the LEV-aware OPC may be iterated only for some markers MRK in which the cost function is reduced. In this case, while the iteration of the OPC continues, the corresponding markers MRK may maintain shapes obtained as a result of the i−1-th LEV-aware OPC.

Referring to Mathematical Equations 5 and 6, as the difference between the best contour enclosure BCE and the enclosure target distance ETD decreases, a value of the cost function increases. As described above, because the bridge target distance BTD is a reference value not allowing a generation of a bridge fault, a final OPC result may secure an enclosure to the maximum as long as a bridge is not generated, thereby reducing a risk of poor contact due to LEVs. The "poor contact" condition between conductive elements (or patterns) may be defined based on one or more reference electrical characteristics.

Figure 7:
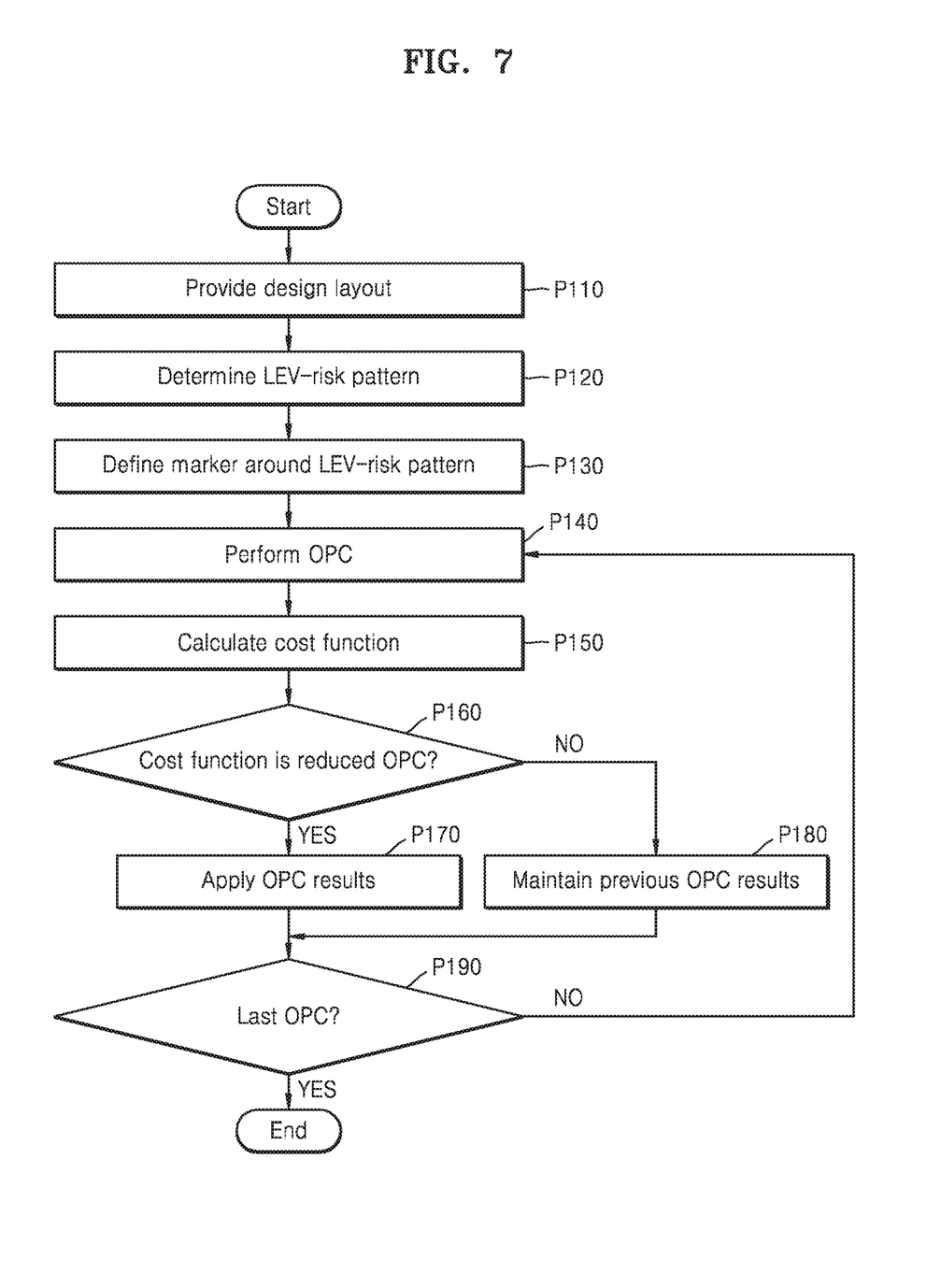
FIGS. 7 and 8 are flowcharts respectively illustrating OPC methods according to some example embodiments.

FIG. 7 is a flowchart illustrating an OPC method according to some example embodiments.

For convenience, repeated descriptions given with reference to FIG. 2 will be omitted and different points will be mainly described.

Referring to FIG. 7, in operation P160, cost functions of the marker MRK before and after i-th LEV-aware OPC may be compared with each other.

When the value of the cost function is reduced in operation P160, a result of the i-th LEV-aware OPC may be applied in operation P170, and when the value of the cost function is increased in operation P160, the result of the i-th LEV-aware OPC may be maintained without reflecting the result of the i-th LEV-aware OPC in operation P180.

Unlike the description with reference to FIG. 2, in operation P190 after operation P170 or P180, whether the OPC is the last OPC may be checked. The number of iterations of the OPC may be set before performing the OPC, and the OPC may be terminated when the set number of iterations of the OPC is completed. Because the LEV-aware OPC may be terminated depending upon a change in the value of the cost function before the set number of iterations of the OPC is completed, the number of iterations of the LEV-aware OPC for some of the markers MRK may be less than the number of iterations of the overall OPC.

Figure 8:
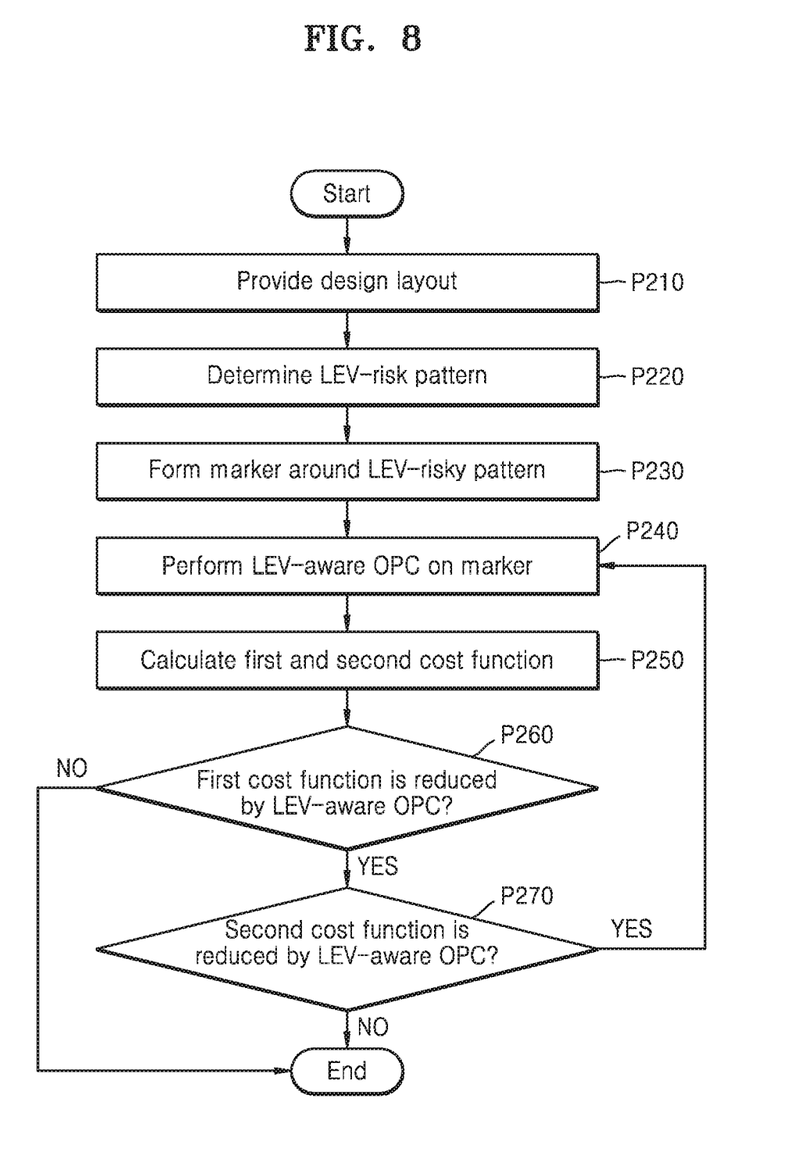

FIG. 8 is a flowchart illustrating an OPC method according to some example embodiments.

For convenience, repeated descriptions given with reference to FIG. 2 will be omitted and different points will be mainly described.

Referring to FIG. 8, operations P210 to P240 of FIG. 8 may be identical or substantially similar to operations P110 to P140 described with reference to FIG. 2, respectively.

Next, in operation P250, first and second cost functions may be calculated.

According to some example embodiments, the first and second cost functions, that is, C1i and C2i, according to a result of the i-th OPC iteration, may be calculated by Mathematical Equation 7.

$$C1i = \sum_{f=1}^{n} \left(\sqrt{[\{PCD - BTD\}_f]^2}\right)$$ [Mathematical Equation 7]

$$C2i = \sum_{f=1}^{n} \left(\sqrt{[\{BCE - ETD\}_f]^2}\right)$$

Accordingly, the first cost function may be proportional to a difference between the bridge target pattern BRTP (which is associated with the bridge target distance BTD) and the PWC contour PCC (which is associated with the PWC contour distance PCD), and the second cost function may be proportional to a difference between the enclosure target pattern ENCTP (which is associated with the enclosure target distance ETD) and the LEV-aware OPC best contour LAOBC (which is associated with the best contour enclosure BCE) that has been modified.

In some example embodiments, the first and second cost functions C1i and C2i, according to a result of the i-th OPC iteration may be calculated by Mathematical Equation 8.

$$C1i = \sum_{f=1}^{n} ([\{PCD - BTD\}_f]^2)$$ [Mathematical Equation 8]

$$C2i = \sum_{f=1}^{n} ([\{BCE - ETD\}_f]^2)$$

Next, in operation P260, a value of the first cost function according to a result of the i-th OPC iteration may be compared with a value of the first cost function according to a result of an i−1-th OPC iteration. According to some example embodiments, when the value of the first cost function according to the result of the i-th OPC iteration is reduced from the value of the first cost function according to the result of the i−1-th OPC iteration ("Yes"), a comparison of the second cost function may be performed in operation P270. On the other hand, when the value of the first cost function according to the result of the i-th OPC iteration is increased from the value of the first cost function according to the result of the i−1-th OPC iteration ("No"), the iteration of the LEV-aware OPC may be terminated.

Referring to FIG. 4, the first cost function is proportional to a difference between the bridge target pattern BRTP and the PWC contour PCC (e.g., the difference between the PWC contour distance and the PWC target distance). For example, before the LEV-aware OPC is performed, the PWC contour distance may be greater than the PWC target distance. As the LEV-aware OPC is repeatedly performed, because the PWC contour PCC is closer to the bridge target pattern BRTP, the difference between the PWC contour distance and the PWC target distance is reduced, and thus the value of the first cost function is also reduced. Here, an increase in the value of the first cost function by LEV-aware OPC iteration means that the PWC contour PCC is larger than the bridge target pattern BRTP. The bridge target pattern BRTP is a target shape for mitigating or preventing a bridge fault, and that the PWC contour PCC is larger than the bridge target pattern BRTP may mean that a risk of generating the bridge fault is high.

Therefore, when the first cost function is increased by specific LEV-aware OPC, the LEV-aware OPC may be terminated. Here, a comparison of the first cost function may be performed separately for each marker MRK. For example, when the value of the first cost function is increased by the LEV-aware OPC for some markers MRK among a plurality of markers MRK, only the LEV-aware OPC for the markers MRK having an increase in the value of the first cost function may be terminated.

Next, in operation P270, a value of the second cost function according to the result of the i-th OPC iteration may be compared with a value of the second cost function according to the result of the i−1-th OPC iteration. According to some example embodiments, when the value of the second cost function according to the result of the i-th OPC iteration is reduced from the value of the second cost function according to the result of the i−1-th OPC iteration ("Yes"), returning to operation P240, the LEV-aware OPC may be iterated. On the other hand, when the value of the second cost function according to the result of the i-th OPC iteration is increased from the value of the second cost function according to the result of the i−1-th OPC iteration ("No"), the iteration of the LEV-aware OPC for the corresponding markers MRK may be terminated.

Making the second cost function be minimized means that the enclosure is secured to the maximum, as described above. Thus, the risk of poor contact due to LEVs may be reduced. In some cases, in operation P270, a sum of the first cost function and the second cost function according to the i-th LEV-aware OPC may be compared with a sum of the first cost function and the second cost function according to the i−1-th LEV-aware OPC.

Figure 9:
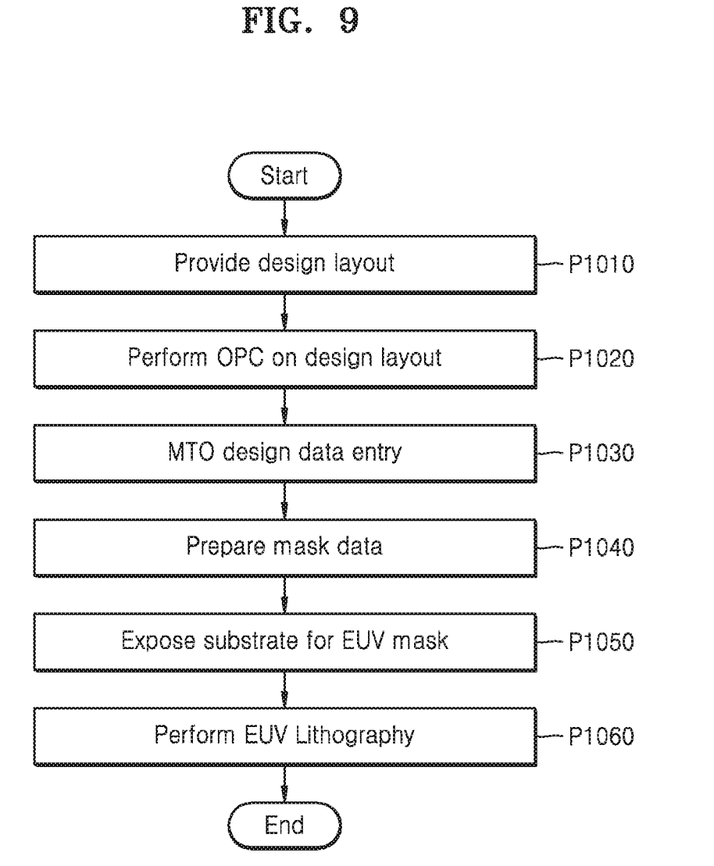
FIG. 9 is a flowchart illustrating processes of a method of fabricating a semiconductor device, according to some example embodiments.

FIG. 9 is a flowchart illustrating processes of a method of fabricating a semiconductor device, according to some example embodiments.

Referring to FIG. 9, in operation P1010, a design layout for forming a semiconductor device may be provided. Operation P1010 may be identical or substantially similar to operation P110 described with reference to FIG. 2.

Next, referring to FIGS. 3 and 8, in operation P1020, OPC may be performed on the design layout. The performing of the OPC may include performing first and second OPCs different from each other.

According to some example embodiments, the first OPC may be performed on patterns in markers MRK. According to some example embodiments, the first OPC may be one of the LEV-aware OPC described with reference to FIGS. 2 to 6, the LEV-aware OPC described with reference to FIG. 7, and the LEV-aware OPC described with reference to FIG. 8. The second OPC may be OPC for regions other than the markers MRK.

According to some example embodiments, the performing of the OPC may be iterated a plurality of times. During the process of the iteration, the first OPC for some or all of the markers MRK may be terminated first, as described with reference to FIGS. 2, 6, and 7. Thus, the number of iterations of the second OPC may be equal to or greater than the number of iterations of the first OPC.

Next, in operation P1030, mask tape-out (MTO) design data may be input. The acronym "MTO" may mean that design data for which the OPC is completed is transferred to request the fabrication of a mask. According to some example embodiments, the MTO design data may have a graphic data format used in electronic design automation (EDA) software or the like. According to some example embodiments, the MTO design data may have a data format such as GDS2, CIF, OASIS, or the like.

Next, in operation P1040, mask data preparation (MDP) may be performed. According to some example embodiments, for example, the MDP may include format conversion referred to as fracturing, augmentation of a barcode for mechanical reading, a standard mask pattern for inspection, a job-deck, and/or automatic and manual verification. According to some example embodiments, the job-deck may refer to making a text file including a series of instructions regarding arrangement information of multiple mask files, an exposure speed or method, and the like. To mitigate or prevent defaults due to tolerances by securing sufficient margins in semiconductor fabrication processes, the MDP may include mask rule check in which it is checked whether a modified design layout complies with mask generation rules including limitations on specific geometrical shapes and connections.

According to some example embodiments, the format conversion, that is, the fracturing may refer to a process of dividing the MTO design data by region and then changing the MTO design data into a format for electron beam writers. According to some example embodiments, the fracturing may be a process proactively performed to improve the quality of a final mask and correct a mask process. The fracturing may include, for example, data manipulation (e.g., scaling, sizing of data, rotation of data, pattern reflection, or color inversion).

According to some example embodiments, in the process of the conversion through the fracturing, data regarding systematic errors, which may be generated during the process of transfer from design data to an image on a semiconductor substrate, may be corrected. For example, the systematic errors may be generated by distortions, which occur in processes such as mask development and etching, semiconductor substrate imaging, and the like.

According to some example embodiments, the MDP may include mask process correction (MPC) that is a data correction process regarding the systematic errors. According to some example embodiments, the MPC may include operations such as adjusting critical dimensions and/or improving pattern arrangement precision.

Next, in operation P1050, a substrate for masks may be exposed based on mask data. According to some example embodiments, the exposure may be performed by, for example, electron beam writing. According to some example embodiments, the electron beam writing may be performed in a manner such as grey writing using a multi-beam mask writer (MBMW). According to some example embodiments, the electron beam writing may be performed by using a variable shape beam (VSB) writer.

According to some example embodiments, data processing may be performed before the exposure process. According to some example embodiments, the data processing is a kind of pre-processing process for the mask data and may include grammar check for the mask data, exposure time prediction, or the like. According to some example embodiments, after the MDP, before the exposure process, a process of converting the mask data into pixel data may be performed. The pixel data may be data used directly for actual exposure and may include data regarding shapes that are exposure objects and doses assigned to the respective shapes. According to some example embodiments, the data regarding the shapes that are exposure objects may be bit-map data converted from shape data, which is vector data, through rasterization or the like.

Next, a lithography mask may be formed by performing subsequent processes. According to some example embodiments, the subsequent processes may include processes such as development, etching, and cleaning. According to some example embodiments, the subsequent processes for forming the lithography mask may include a measurement process and a defect inspection or repair process. According to some example embodiments, the subsequent processes for forming the lithography mask may include a pellicle coating process. The pellicle coating process may refer to a process in which it is confirmed that there is no contamination particles or chemical stains on a surface of the lithography mask, followed by attaching a pellicle onto the surface of the lithography mask to protect the lithography mask from contamination, impact, or the like during the transportation and available lifespan of the lithography mask.

Next, in operation P1060, various semiconductor processes may be performed on a semiconductor substrate by using the lithography mask, thereby forming a semiconductor chip. According to some example embodiments, a process using the lithography mask may include a patterning process through a lithography exposure process, or the like. According to some example embodiments, a desired pattern may be formed on the semiconductor substrate or a material layer through the process using the lithography mask.

According to some example embodiments, the process using the lithography mask may include a deposition process, an etching process, an ion process, a cleaning process, or the like. According to some example embodiments, the deposition process may include a process of depositing a material layer, such as chemical vapor deposition, atomic layer deposition, sputtering, or spin coating. According to some example embodiments, the ion process may include a process such as ion implantation, diffusion, or heat treatment. According to some example embodiments, the process using the lithography mask may include a packaging process in which a semiconductor chip is mounted onto a printed circuit board (PCB) and then sealed with a sealant. According to some example embodiments, the process using the lithography mask may include a test process in which a test is performed on a semiconductor chip or package.

While the inventive concepts have been particularly shown and described with reference to some example embodiments thereof, it will be understood by one of ordinary skill in the art that various changes in form and details may be made therein without departing from the spirit and scope of the following claims. In addition, it should be understood that particular terms used herein are only for the purpose of describing the disclosed example embodiments and are not intended to limit the inventive concepts. Therefore, the scope of the inventive concepts should be defined by the accompanying claims and equivalents thereof.

What is claimed is:

1. An optical proximity correction (OPC) method comprising:
   providing a design layout including conductive patterns;
   determining line end void (LEV)-risk patterns among the conductive patterns, the LEV-risk patterns each having a risk of suffering from poor contact due to an LEV;
   setting markers including portions of the LEV-risk patterns and portions of the conductive patterns adjacent to the LEV risk patterns;
   performing LEV-aware OPC on the LEV-risk patterns; and
   calculating at least one cost function of each of the markers using information associated with a corresponding one of the LEV-risk patterns and a process window condition, wherein
   the LEV-aware OPC takes a bridge target pattern as a target shape, the bridge target pattern being determined by a bridge target that is a minimum distance between the conductive patterns.

2. The OPC method according to claim 1, wherein the LEV-aware OPC takes an enclosure target pattern as a target shape, the enclosure target pattern being determined by a first enclosure target and a second enclosure target, the first enclosure target being a first minimum distance between an upper or lower conductive via adjacent to each of the LEV-risk patterns and an end point of each of the LEV-risk patterns in one direction, the second enclosure target being a second minimum distance between the upper or lower conductive via adjacent to each of the LEV-risk patterns and an adjacent one of the conductive patterns in another direction different from the one direction.

3. The OPC method according to claim 2, wherein the calculating comprises calculating an LEV-aware OPC best contour and a process window condition (PWC) contour, the LEV-aware OPC best contour being a first contour according to an optimum condition for each of the LEV-risk patterns that has been modified, and the PWC contour being a second contour according to the process window condition.

4. The OPC method according to claim 3, wherein
   the at least one cost function comprises a first cost function and a second cost function, and
   the first cost function is proportional to a difference between the bridge target pattern and the PWC contour.

5. The OPC method according to claim 4, further comprising:
   terminating the LEV-aware OPC in response to a present value of the first cost function being greater than an immediately preceding value of the first cost function.

6. The OPC method according to claim 4, wherein the second cost function is proportional to a difference between the enclosure target pattern and the LEV-aware OPC best contour that has been modified.

7. The OPC method according to claim 6, wherein the performing the LEV-aware OPC is iterated in response to a present value of the second cost function being less than from an immediately preceding value of the second cost function.

8. The OPC method according to claim 1, wherein
   the determining comprises comparing risks of an occurrence of poor contact in each of the conductive patterns based on a scoring function, and
   the scoring function is inversely proportional to a width of each of the conductive patterns.

9. The OPC method according to claim 8, wherein the scoring function is inversely proportional to a distance between an end of each of the conductive patterns and a via, which contacts each of the conductive patterns, in an extension direction of the each of the conductive patterns.

10. An optical proximity correction (OPC) method comprising:
    providing a design layout including conductive patterns;
    determining line end void (LEV)-risk patterns among the conductive patterns, the LEV-risk patterns each having a risk of suffering from poor contact due to an LEV;
    setting markers including portions of the LEV-risk patterns and portions of the conductive patterns adjacent to the LEV-risk patterns;
    performing a first OPC on first patterns included in the markers and performing a second OPC on second patterns outside the markers, the second OPC being different from the first OPC, and each of the first OPC and the second OPC being performed a plurality of times; and
    calculating a cost function of each of the markers using information associated
    with a corresponding one of the LEV-risk patterns and a process window condition, wherein
    the determining includes comparing risks of occurrence of poor contact in each of the conductive patterns based on a scoring function, and
    the scoring function is inversely proportional to a width of each of the conductive patterns.

11. The OPC method according to claim 10, wherein the scoring function is inversely proportional to a distance between an end of each of the conductive patterns and a via, which contacts the each of the conductive patterns.

12. The OPC method according to claim 10, wherein a first number of iterations of the first OPC is equal to or less than a second number of iterations of the second OPC.

13. The OPC method according to claim 10, further comprising:
    terminating the first OPC for one or more first markers from among the markers, in response to a present value of the cost function of the one or more first markers being greater than an immediately previous value of the cost function thereof.

14. A method of fabricating a lithography mask, the method comprising:
    providing a design layout including conductive patterns;
    performing optical proximity correction (OPC) on the design layout; and
    fabricating the lithography mask according to a result of the performing,
    wherein the performing includes,
    determining line end void (LEV)-risk patterns among the conductive patterns, the LEV-risk patterns each having a risk of suffering from poor contact due to an LEV, setting markers including portions of the LEV-risk patterns and portions of the conductive patterns adjacent to the LEV-risk patterns, performing first OPC on patterns inside the markers and performing second OPC on patterns outside the markers, the second OPC being different from the first OPC, and calculating each of a plurality of cost functions of each of the markers by using an LEV-aware OPC best contour and a process window condition (PWC) contour, the LEV-aware OPC best contour being a first contour according to an optimum condition for each of the LEV-risk patterns that has been modified by the first OPC, and the PWC contour being a second contour according to a PWC for each of the LEV-risk patterns that has been modified by the first OPC.

15. The method according to claim 14,
wherein the OPC is iterated a plurality of times, and
a first number of iterations of the second OPC is equal to or greater than a second number of iterations of the first OPC.

16. The method according to claim 14, wherein the first OPC takes, as target shapes, a bridge target pattern determined by a bridge target that is a first minimum distance between the conductive patterns; and
an enclosure target pattern determined by a first enclosure target and a second enclosure target, the first enclosure target being a second minimum distance between an upper or lower conductive via adjacent to each of the LEV-risk patterns and an end point of each of the LEV-risk patterns in one direction, the second enclosure target being a third minimum distance between the upper or lower conductive via adjacent to each of the LEV-risk patterns and an adjacent one of the conductive patterns in another direction different from the one direction.

17. The method according to claim 16, wherein
the plurality of cost functions includes a first cost function and a second cost function, and
the first cost function is proportional to a difference between the bridge target pattern and the PWC contour.

18. The method according to claim 17, further comprising:
terminating the first OPC in response to a present value of the first cost function being greater than an immediately previous value of the first cost function.

19. The method according to claim 17, wherein the second cost function is proportional to a difference between the LEV-aware OPC best contour and the enclosure target pattern.

20. The method according to claim 19, further comprising: maintaining shapes of the conductive patterns in some of the markers before performing the first OPC in response to a present value of the second cost function of the some of the markers being greater than an immediately previous value of the second cost function thereof.

* * * * *